(12) United States Patent
Cornwell et al.

(10) Patent No.: US 7,869,277 B1
(45) Date of Patent: Jan. 11, 2011

(54) MANAGING DATA WRITING TO MEMORIES

(75) Inventors: Michael J. Cornwell, San Jose, CA (US); Christopher P. Dudte, San Jose, CA (US)

(73) Assignee: Apple Inc., Cupertino, CA (US)

( * ) Notice: Subject to any disclaimer, the term of this patent is extended or adjusted under 35 U.S.C. 154(b) by 728 days.

(21) Appl. No.: 11/739,827

(22) Filed: Apr. 25, 2007

(51) Int. Cl.
*G11C 16/04* (2006.01)

(52) U.S. Cl. ............................ 365/185.11; 365/185.08; 365/189.2

(58) Field of Classification Search ............ 365/185.33, 365/185.12, 185.11
See application file for complete search history.

(56) References Cited

U.S. PATENT DOCUMENTS

| | | | |
|---|---|---|---|
| 5,602,987 A | 2/1997 | Harari et al. | |
| 5,671,229 A | 9/1997 | Harari et al. | |
| 5,719,808 A | 2/1998 | Harari et al. | |
| 6,149,316 A | 11/2000 | Harari et al. | |
| 6,426,893 B1 | 7/2002 | Conley et al. | |
| 6,721,820 B2 | 4/2004 | Zilberman et al. | |
| 6,757,842 B2 | 6/2004 | Harari et al. | |
| 6,763,424 B2 | 7/2004 | Conley | |
| 6,914,846 B2 | 7/2005 | Harari et al. | |
| 6,947,332 B2 | 9/2005 | Wallace et al. | |
| 7,137,011 B1 | 11/2006 | Harari et al. | |
| 7,162,569 B2 | 1/2007 | Conley et al. | |
| 7,203,119 B2 * | 4/2007 | Lee ............................. | 365/226 |
| 7,237,046 B2 | 6/2007 | Paley et al. | |
| 7,237,074 B2 | 6/2007 | Guterman et al. | |
| 7,240,219 B2 | 7/2007 | Teicher et al. | |
| 7,573,743 B2 * | 8/2009 | Murakami et al. ..... | 365/185.11 |
| 2007/0070704 A1 * | 3/2007 | Ho et al. ................. | 365/185.22 |
| 2007/0183198 A1 * | 8/2007 | Otsuka et al. .......... | 365/185.04 |

* cited by examiner

*Primary Examiner*—Vu A Le
*Assistant Examiner*—Han Yang
(74) *Attorney, Agent, or Firm*—Fish & Richardson P.C.

(57) ABSTRACT

Systems and processes may use a first memory, a second memory, and a memory controller. The second memory is at least as large as a block of the first memory. Data is received and stored in the second memory for further writing to the second memory.

15 Claims, 6 Drawing Sheets

MANAGING DATA WRITING TO MEMORIES

TECHNICAL FIELD

The present invention relates to systems and processes managing memories, and more particularly to managing write processes in memories.

BACKGROUND

Nonvolatile memory, such as flash memory, may include three types of blocks: data blocks, free blocks, and log blocks. Data blocks may hold user data and/or metadata. Free blocks may include empty blocks or blocks previously deleted. Log blocks may be reserved blocks to store temporary data. For example, when writing data to flash memory, log blocks may be used to temporarily hold data. Blocks may switch between the three types of categories.

Blocks of data may be divided into cells; however, cells may not be individually erasable. When data is written to a block, data in some cells may change while data in other cells may be replaced. Data that is not replaced may be transferred to log blocks. The block may then be erased and the cells with replaced data may be written. Thus, two partially filled blocks may now exist, the log block with the transferred data and the data block with the new data. Log blocks may be "merged" or consolidated to create more room for data storage. Thus, replacing data in cells of a block may involve multiple processes and use of multiple blocks.

SUMMARY

In one general aspect, data to be written to a nonvolatile first memory is stored in a second memory, and the data stored in the first memory is written to a block of the second memory. The second memory is coupled to the first memory and a memory controller. The second memory is at least as large as the block of the first memory, and data is written to the block of the first memory in the sequence the data is stored in the second memory.

Implementations may include one or more of the following features. The first memory may include electrically erasable memory. Cells of a block of the first memory may not be individually erasable. Data to be stored in the first memory may be received. A block of the first memory may include data. At least a portion of data in the block of the first memory may be written to the second memory. A portion of data written to the second memory may include data to be unchanged by the received data to the block. A portion of the data may be written to the second memory from the first memory. Data may be sequentially written to the second memory in the sequence that data will be stored on the first memory. A block of the first memory may be erased.

In another general aspect, a first set of data to be written to a block of a first memory is received. The first set of data is stored in a second memory. A determination is made if at least a portion of a second set of data on the block will be unchanged by the first set of data, and at least a portion of the second set of data is written to the second memory and the portion will be unchanged by writing the first set of data to the block. The first set of data and at least the portion of the second set of data is sequentially written to the second memory in the sequence the first set of data and at least the portion of the second set of data will be stored on the first memory. The second memory is coupled to the first memory and a memory controller. The second memory may be at least as large as a block of the first memory. The first memory is nonvolatile memory.

Implementations may include one or more of the following features. The first set of data may be compared to a second set of data on the block of the first memory. Data stored in the second memory may be written to one of the blocks of the first memory. Data stored on the second memory that is changed by the first set of data may be identified. The block in the first memory in which data is changed by the first set of data may be identified.

In one general aspect, a first memory is a non-volatile memory that includes one or more blocks, and each block includes one or more cells that are not individually erasable. A second memory is coupled to the first memory. The second memory is at least as large as one of the blocks of the first memory. A memory controller is coupled to the first memory and the second memory. The memory controller writes data in the second memory in the sequence the data is to be stored on the first memory.

Implementations may include one or more of the following features. The memory controller may receive data to be written to the first memory. The memory controller may identify data on the first memory to be changed by the data received. The first memory may be a NAND flash memory. The second memory may be a cache.

The details of one or more implementations are set forth in the accompanying drawings and the description below. Other features will be apparent from the description, the drawings, and from the claims.

DETAILED DESCRIPTION

Like reference symbols in the various drawings indicate like elements.

Figure 1:
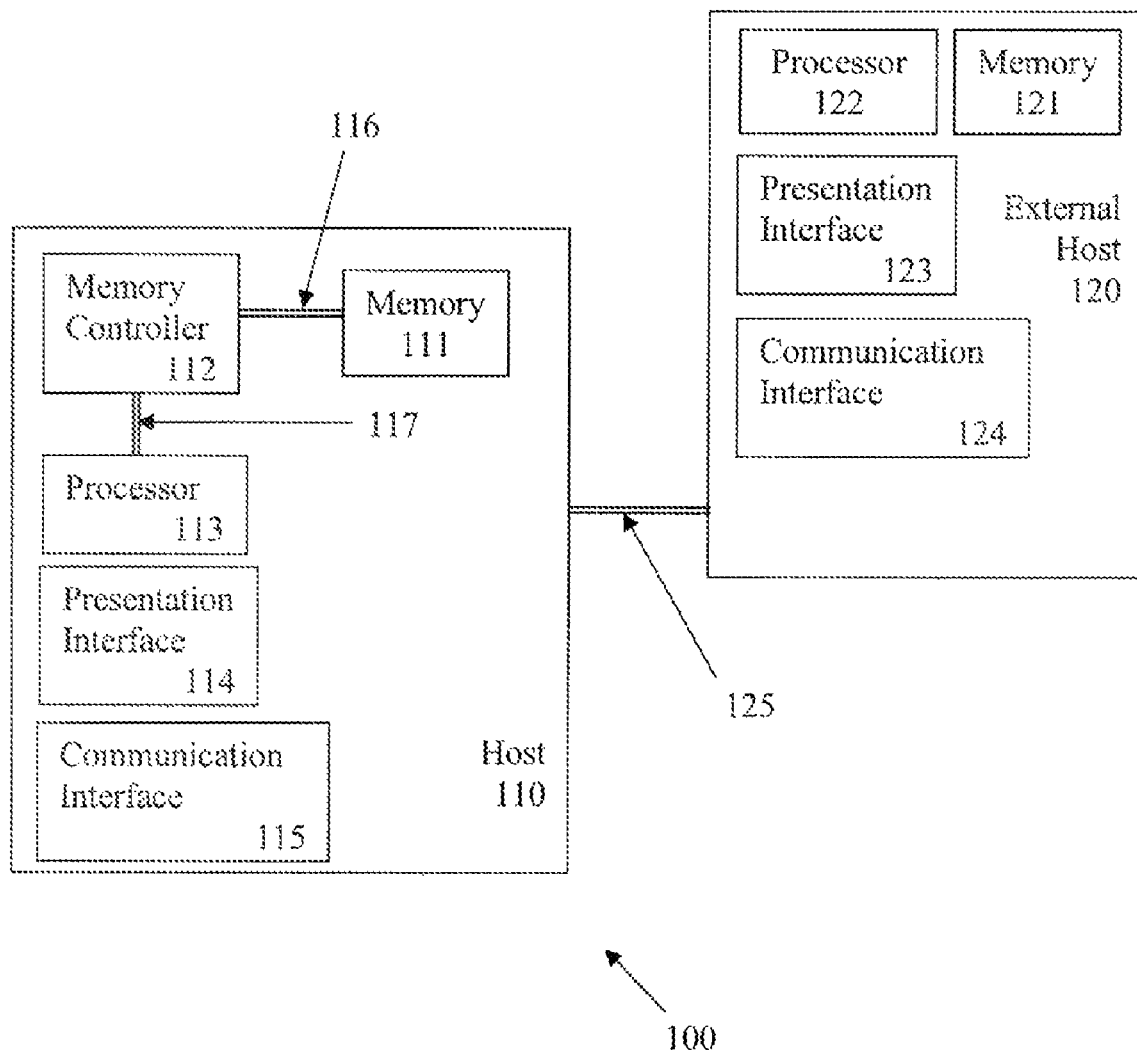
FIG. 1 illustrates an example of a host and an external host.

FIG. 1 illustrates an example system 100. System 100 may include a host 110. Host 110 may be any electronic or computing device that uses nonvolatile memory including, for example, portable and desktop computers, clients, servers, consumer electronics, calculators, network appliances, media players/recorders, game consoles, mobile phones, email devices, personal digital assistants (PDAs), embedded devices, televisions, system-on-chip (SoC), set-top boxes, audio recorders, handheld data collection scanners, and/or monitoring devices. Host 110 may include a memory 111, a memory controller 112, a processor 113, a presentation interface 114, and/or a communication interface 115. Memory controller 112 and/or processor 113 may include individual chips, a chip set, or can be integrated together on a single chip (e.g., a SoC solution).

Memory 111 may be nonvolatile memory, such as read-only memory (ROM), optical memory (e.g., CD, DVD, or LD), magnetic memory (e.g., hard disk drives, floppy disk drives), NAND flash memory, NOR flash memory, electrically-erasable, programmable read-only memory (EEPROM), Ferroelectric random-access memory (FeRAM), magnetoresistive random-access memory (MRAM), nonvolatile random-access memory (NVRAM), non-volatile static random-access memory (nvSRAM), phase-change memory (PRAM), and/or any other memory that does not need its memory contents periodically refreshed and/or can retain information without power. Memory 111 may include memory chips or memory modules (e.g., single in-line memory modules (SIMMs) or dual in-line memory modules (DIMMs)). In some implementations, memory 111 may be electrically erasable. Memory 111 may have a finite number of write/erase cycles. For example, after a number of write/erase cycles, the ability of a cell of memory 111 to maintain a specified charge may be impaired. For example, a memory cell may leak electrons. As another example, an electric charge may not be substantially removable from a memory cell. Cells of a nonvolatile memory may not be individually erasable, such as in flash memory. For example, a cell of a block may be erased by erasing the entire block in which the cell resides. Similarly, writing new data to a portion of a block may require erasing the entire block and rewriting any unchanged portions of the block along with the new data.

Figure 2:
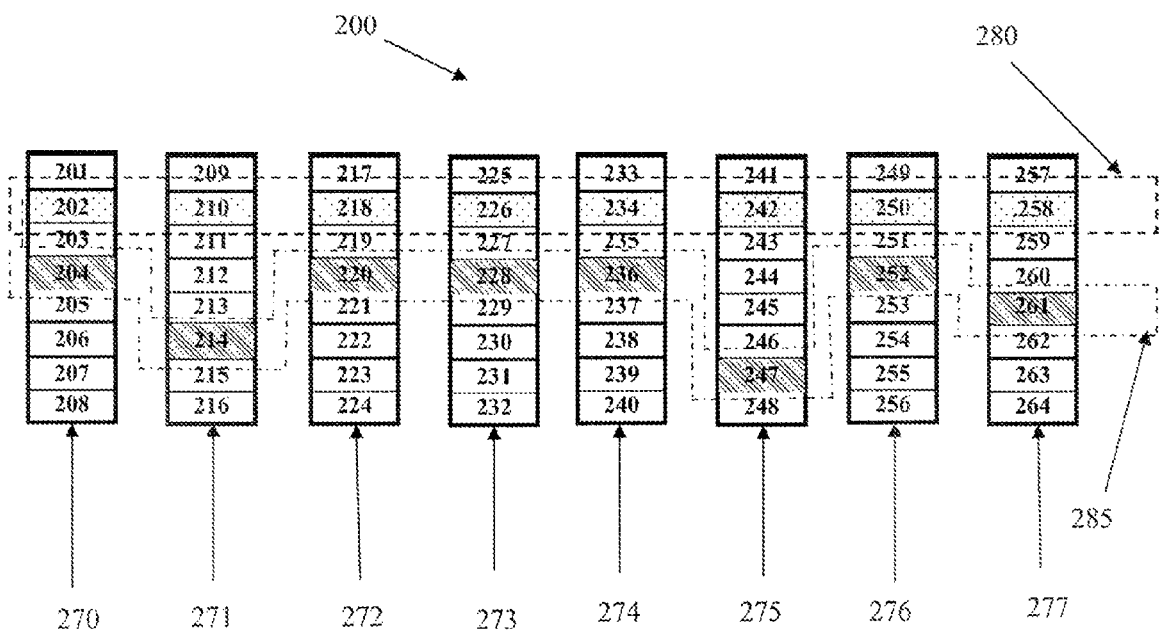
FIG. 2 illustrates an example configuration of a memory.

In some implementations, memory may be interleaved to increase performance of the host. FIG. 2 depicts a representation of a portion of a memory 200. Memory 200 may include physical blocks 270-277. Each physical block 270-277 may include cells 201-264. For example, physical block 270 may include cells 201-208 and physical block 271 may include cells 209-216. The physical blocks 270-277 and cells 201-264 depicted in FIG. 2 are for purposes of illustration and do not represent a typical implementation. For example, in the case of flash memory, physical blocks typically include a much larger number of cells (e.g., sufficient to store 512 or 2048 bytes), which may be divided into pages (e.g., of 64 bytes), although any size of physical blocks and any number of cells can be used.

During operation, memory 111 may receive signals from memory controller 112 over Input/Output (I/O) bus 116, which enables memory 111 to carry out memory access requests (e.g., read or write operations) received by the memory controller 112 from the processor 113 (see FIG. 1). Memory 111 may be interleaved, so that read or write requests to logical block addresses 280, 285 (LBAs) are mapped to physical memory addresses that include two or more physical blocks 270-277 (see FIGS. 1 and 2). Interleaving may increase performance (e.g., by decreasing read and/or write times by allowing multiple parallel reads or writes) or protecting against lost data (e.g., by providing some degree of redundancy across different physical blocks) of memory 111. Host 110 (e.g., using processor 113) may perform reads and writes to LBAs 280 and 285, which are mapped or translated (e.g., by memory controller 112) to physical block addresses 270-277 of memory. For example, LBA 280 includes cells 202, 210, 218, 226, 234, 242, 250, and 258 and LBA 285 includes cells 204, 214, 220, 228, 236, 247, 252, and 261. In some situations, mapping may help make a memory appear similar to a hard disk drive to the host (e.g., to the operating system of the processor).

In some implementations, physical blocks may be mapped to virtual blocks. Virtual blocks may make a memory appear continuous. For example, bad blocks may be omitted from a virtual block listing. Virtual blocks may be mapped to LBAs to increase memory performance by allowing interleaving.

Memory controller 112 may be any device that manages memory access including, for example, programmable memory controllers, flash disk controllers, direct memory access (DMA) controllers, logic devices, field-programmable gate arrays (FPGAs), and/or central processing units (CPUs).

Examples of memory controller 112 may include the family of ATA Flash Disk Controllers (e.g., device nos. SST55LD019A, SST55LD019B, SST55LD019C, etc.), manufactured by Silicon Storage Technology, Inc. (Sunnyvale, Calif.). In some implementations, memory controller 104 supports single-level cell (SLC) and/or multi-level cell (MLC) flash media.

In some implementations, memory controller 112 may recognize control, address, and/or data signals transmitted on bus 117 by processor 113. Memory controller 112 may translate the control, address, and/or data signals into memory access requests on memory 111. Bus 117 may be an Integrated Drive Electronics (IDE)/Advanced Technology Attachment (ATA) bus that transfers control, address and data signals using IDE/ATA standard bus protocol (e.g., ATA-6 bus protocol). IDE/ATA signals may be generated by processor 113 and translated by the memory controller 112 into memory access requests in a format or protocol appropriate for communicating with the memory 111 across bus 116.

Processor 113 may include a programmable logic device, a microprocessor, or any other appropriate device for manipulating information in a logical manner. A processor may execute the operating system for the host. An example of processor 113 is a PP5002 Superintegration™ SoC controller manufactured by PortalPlayer, Inc. (San Jose, Calif.). The PP5002 controller may provide a platform for media player/recorder systems and/or other products that use non-volatile memory.

During use, an application running on processor 113 may request access to data stored on memory 111, see FIG. 1. For example, a user of a host 110 (e.g., a media player/recorder) or an external host 120 (e.g., a desktop or laptop computer) connected to the host 110 may submit a request to save a song to memory 111. A media player/recorder application may send the request to an operating system running on the processor 113, which formats the request into IDE/ATA signals. IDE/ATA signals may be transmitted to memory controller 112 on bus 117 by processor 113. Memory controller 112 may translate the request to access memory 111 via bus 116.

In some implementations, processor 113 may include memory controller 112. For example, the processor 113 and memory controller 112 may be an integrated processor unit. Processors with integrated memory controllers may be commercially available from Freescale Semiconductor (Austin, Tex.) and Texas Instruments (Dallas, Tex.). Utilizing an integrated processor 113 and memory controller 112 may decrease production cost of host 110, facilitate manufacture of host 110, and/or make process execution more efficient. For example, utilizing a single processor/memory controller decreases the number of steps in fabrication.

Presentation interface 114 may present data such as videos, music, messages from the host 105 and/or external host 120, graphical interface for various applications stored on the host (e.g., graphical interface for playing music, videos, manipulating data, etc). For example, presentation interface 114 may present data in visual and/or audio format. Presentation interface 114 may include display device, such as a screen, and/or speakers. Presentation interface may include a graphical interface.

Communication interface 115 may allow communication with other devices. Communication interface 115 may transmit data from host 110 to, and/or receive data from, external host 120 via network protocols (e.g., TCP/IP, Bluetooth, and/or Wi-Fi) and/or a bus (e.g., serial, parallel, USB, and/or FireWire).

Figure 3:
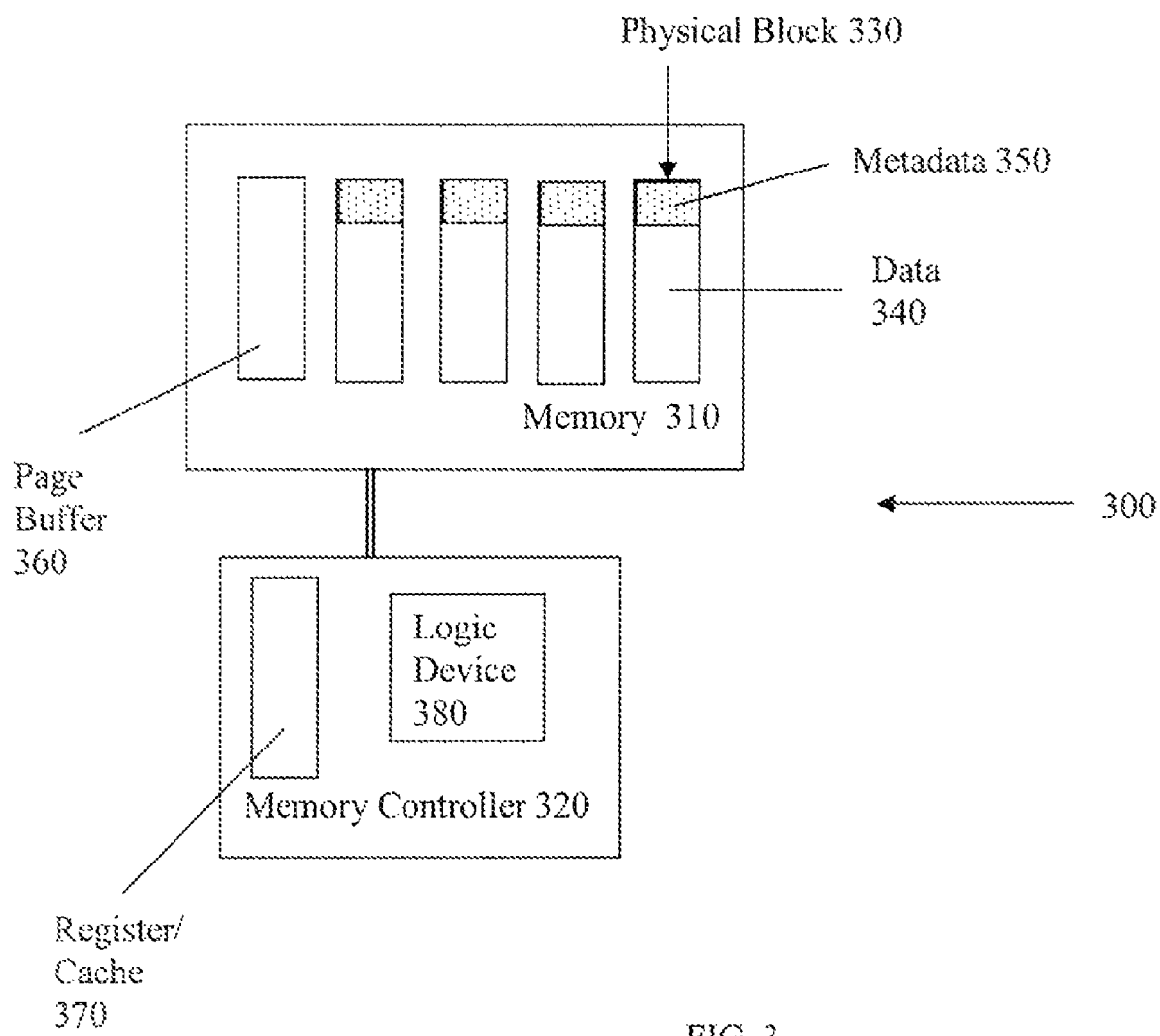
FIG. 3 illustrates an example of a memory controller coupled to a memory.

FIG. 3 illustrates a portion 300 of a host including a memory 310 and a memory controller 320. Memory 310 may include physical blocks 330 that store data 340 or are capable of storing data. A portion of a physical block 330 may store metadata 350. Metadata may include information about other data in the memory, such as listings of bad blocks in a memory or error correcting codes. Memory 310 may include a first buffer 360 (e.g., a page buffer) that is used to temporarily store data as it is being written to or read from the blocks 330. Memory controller 320 may include or be coupled to a second buffer 370 (e.g., a register or a cache). Second buffer 370 may be a volatile memory such as RAM or a nonvolatile memory such as flash memory.

Memory controller 320 may include a logic device 380 that interprets operations from a host or external host and/or performs operations on a coupled memory. Memory controller 320 operations may include use of at least two buffers 360 and 370 to facilitate operations (e.g., read or write), facilitate random data access operations, and/or increase performance. For example, memory controller 320 may read data from memory 310. In response to a read request from memory controller 320, data from data portion 340 of memory 310 may be loaded into first buffer 360 (e.g., data register or page register). The data in the first buffer 360 may be transmitted to second buffer 370 (e.g., cache, register, or cache register) which is coupled to memory controller 320. The second buffer 370 may accumulate multiple pages of data from the first buffer. Memory controller 320 may reformat data from second buffer 370 for delivery to processor 113 of the host 110 (see FIG. 1) (e.g., in IDE/ATA format). While or after data is transferred from first buffer 360 to second buffer 370, additional data may be loaded from data portions 340 of memory 310 to the first buffer 360.

Memory controller 320 may also input data received from a host or external host into second buffer 370 (e.g., cache) for programming of the array through first buffer 360.

The memory controller 320 may receive requests to read and/or write data to memory 310. The memory controller 320 may format the requests to an instruction format appropriate for the memory 310 (e.g., from or to IDE/ATA format). The memory controller 320 may then transfer the instructions in the appropriate format to the memory 310. The requests in the memory 310 may then be converted to the appropriate electrical charges or the appropriate portions of the memory may be transferred to the second buffer.

Although the above description discusses portions of each block as being for data and/or for metadata, portions of a block that are used for data or metadata may not be fixed. A particular portion of a block may include metadata at some times and include user data or other data at other times.

Host 110 may be coupled to an external host 120, as illustrated in FIG. 1, to transmit and/or receive data. For example, songs and/or videos may be downloaded from external host 120 (e.g., computer) to host 110, which may be a media player or other portable device. As another example, applications, such as firmware, operating systems, software for playing MP3s, software for playing videos and/or upgrades, updates, and/or modifications to applications (e.g., change in available features such as playlists) may be downloaded from external host 120 to host 110. Furthermore, data from the host 110 may be uploaded to external host 120. In addition, host 110 may be coupled to external host 120 to modify data on memory 111 of the host and/or memory 121 of the external host. Host 110 may be coupled to external host 120 to initiate and/or execute processes on the host.

Host 110 may be temporarily coupled to external host. For example, host 110 may be coupled to external host 120 using a connector 125 (e.g., serial bus, parallel bus, USB, and/or FireWire). Connector 125 may be an electrical connector. Connector 125 may allow a removable connection between host 110 and external host 120. A temporary coupling between host 110 and external host 120 may allow the host, such as a portable device, to be disconnected from the external host and/or physically moved away from the external host.

Host 110 may be wirelessly coupled to external host 120. Data may be transmitted using one or more network protocols (e.g., TCP/IP, Wi-Fi, 802.11g, 802.11n, IR or Bluetooth).

External host 120 may be any electronic or computing device including, for example, portable and desktop computers, clients, servers, consumer electronics, network appliances, etc. An external host 120 may include a memory 121, a processor 122, a presentation interface 123, and/or a communication interface 124.

Memory 121 may be a volatile memory (e.g., RAM) and/or nonvolatile memory (disk drive, flash memory, or other suitable memories). Processor 122 may be a programmable logic device, a microprocessor, or any other appropriate device for manipulating information in a logical manner. Presentation interface 123 may present data. Communication interface 124 may allow communication with other devices, such as host 110.

Figure 4:
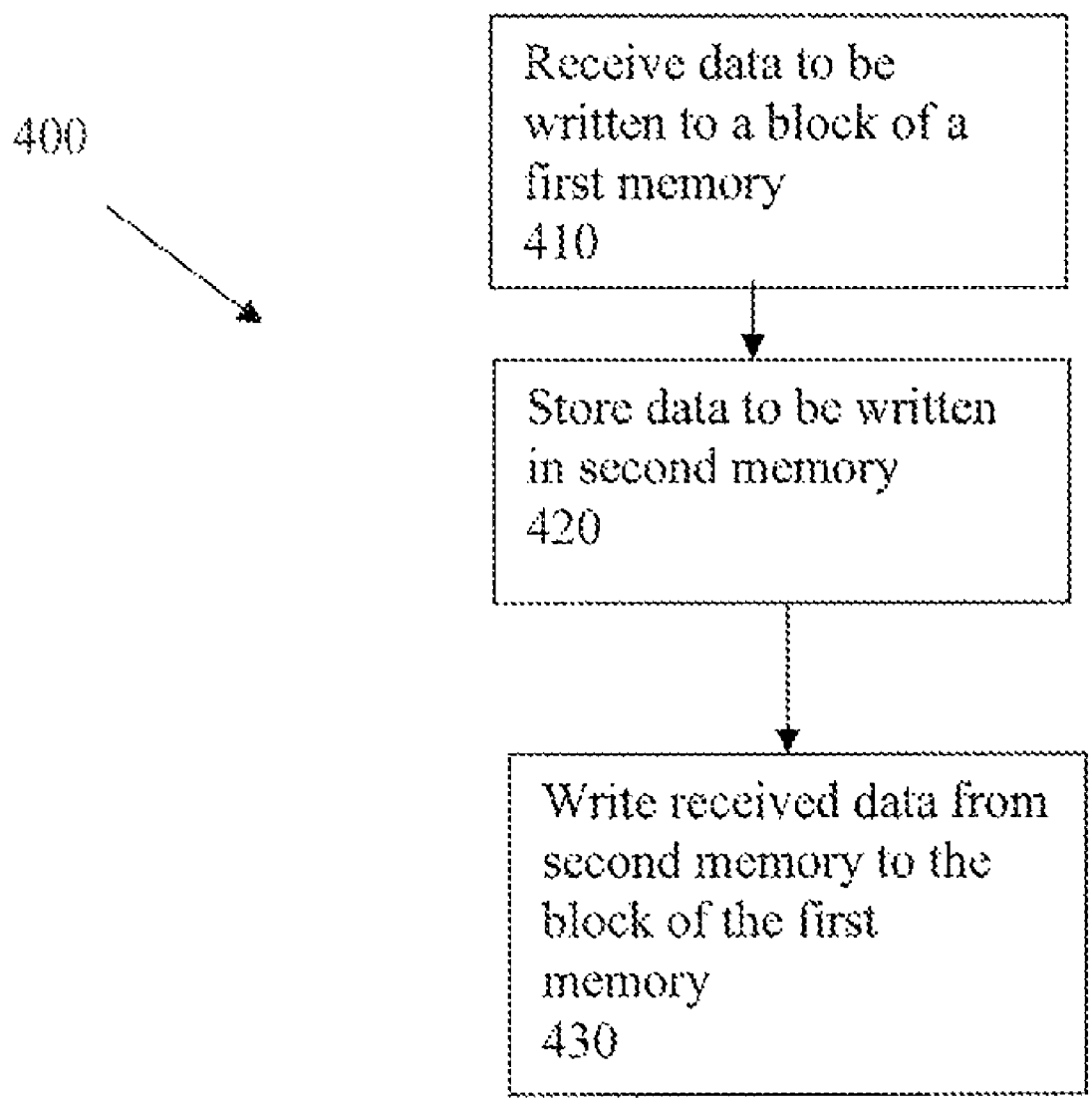
FIG. 4 illustrates an example process for writing data to a memory.

FIG. 4 illustrates an example process 400 for writing data to a memory of a host. Data may be received to be written to a block of a first memory (operation 410). For example, data may be received to be stored on a block of memory 111 of host 110, see FIG. 1. As another example, data may be received from an external host and/or a user. A first memory may be nonvolatile memory, such as a flash memory or other memory in which cells or pages within a block are not individually erasable or writeable.

Data to be written may be stored on a second memory (operation 420). For example, data to be written may be stored on a second buffer 370, see FIG. 3. For example, the second memory may be a cache or register used by a memory controller to temporarily store data to be written to a NAND flash memory or other memory in which cells are erasable in blocks. The memory controller may be separate from or incorporated into a host processor (e.g., processor 113 of FIG. 1). Second memory may be at least as large as a block of the first memory. In some implementations, second memory may be designed or selected to be the same or approximately the same size as a block of the first memory. Data may be stored in the second memory in the sequence data will be stored in the block of the first memory.

Data from the second memory may be written to a block of the first memory (operation 430). For example, data may be written to a block of the first memory in the same order as the data is stored on the second memory. In other words, the second memory may be a cache that is "aligned," or that contains data that is aligned, with the destination block(s) of the first memory, in terms of size and sequence (e.g., of LBAs). This "alignment" may make writing to the first memory more efficient (e.g., by decreasing use of log blocks and associated merge operations necessary to create a data block, free up additional memory space for use as log blocks or data blocks, and/or reduce the number of log blocks on the memory). Moreover, these benefits may also be realized by implementing the caching system of the memory controller such that it is "size-aware" of the virtual blocks in the first memory (e.g., NAND flash memory).

For example, a host, such as a media player, may receive data, such as an MP3 file, from an external host to be stored on a first memory, such as a flash memory, of the host. The first memory may include a plurality of blocks. The host may also include a second memory such as cache, coupled to the processor of the host. The second memory may store approximately the same amount of data as a block of the first memory. For example, a block of the first memory may store approximately $2^{10}$ bytes of data and a second memory may store approximately $2^{10}$ bytes of data. As another example, a block of a first memory may store approximately 1100 bytes of data and a second memory may store approximately $2^{10}$ bytes of data. A first portion of the data, such as approximately $2^{10}$ bytes of data, may be received and stored on the second memory. The second memory may then be written to a block of the first memory in the same order as the data is stored on the second memory.

As another example, a portion of data on a block a first memory may need to be updated. The data related to the update may be received by the host and stored in the second memory. The data that is not to be updated by the received data may also be read into and stored in the second memory. The contents of the second memory may be written to the first memory in the same order the data is stored in the second memory. Erasing and wear of the blocks of first memory may be reduced since the data is written block-wise into the first memory. In addition, since second memory may be a cache memory, for example, data may be written, read, and/or erased randomly, data may be written to the second memory in the same order that the data will be saved in on the first memory. Thus, erasing and wear-leveling activities may be minimized because data may be written block-wise as opposed to in smaller portions. Writing data in these smaller portions may increase wear-leveling activities because when data is written in smaller portions several times to different blocks, wear-leveling activities (which may require multiple erase functions) may be periodically performed to consolidate data onto fewer blocks (e.g., consolidate data onto 2 blocks rather than the memory including 5 partially filled blocks). In addition, by updating data in a block by copying data that will not be updated into the second memory, the data may be written from the second memory to the first memory in the same order that it is stored. This may increase memory life through decreased erasing since the data that is updated is stored in the memory rather than written to another block of the first memory, while a block is erased, and then transferred back to the erased block with the updated data. By utilizing the second memory (e.g., a cache), the blocks of the first memory may be erased fewer times.

Figure 5:
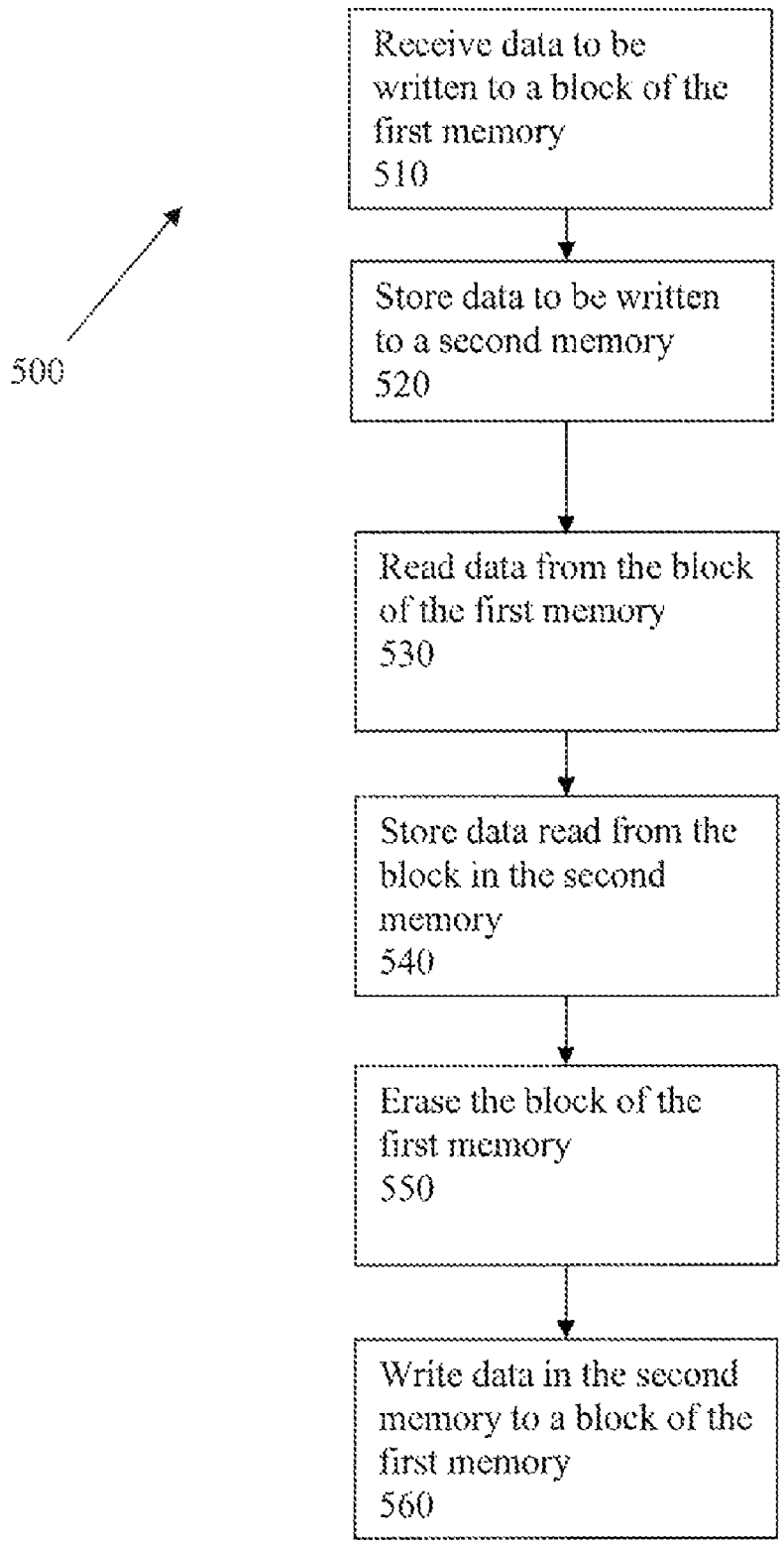
FIG. 5 illustrates an example process for writing data to a block of a memory.

FIG. 5 illustrates an example of a process 500 for writing data to a first memory of a host. Data to be written to a block of a first memory of a host may be received (operation 510). For example, data to be written to a block 330 of memory 310 may be received, see FIG. 3. Data may be received from an external host coupled to the host through a communication interface. In some implementations, data may replace or modify only a portion of data on a block of a memory. A block containing the data to be changed may be identified, and stored data to be changed by the received data may be identified.

The data to be written may be stored on a second memory (e.g., buffer or cache) (operation 520). For example, data to be written to a block 330 of memory 310 may be stored in second buffer 370, see FIG. 3. As another example, a processor that receives data may transmit the data to a cache to be stored. A memory controller may store data on the second memory. The second memory may be a RAM memory, such as dynamic RAM (DRAM). Data may be stored on second memory in the sequence data is to be written to the block of the first memory.

Because cells of a memory may not be individually erasable, blocks of the memory may be erased to rewrite cells of the block. For example, in flash memory, cells may not be individually erasable. Additionally, data that remains unchanged may need to be transferred to another location prior to erasing the cell.

Data may be read from a block of the first memory (operation 530). For example, data that may remain unchanged by the data to be written to the block may be read. As another example, data may be read from a block identified to contain data to be changed. Data unchanged by the data received may be read into the second memory.

Data read from a block of the first memory may be stored in the second memory (operation 540). For example, a portion of data in the block may be stored in the second memory. As another example, data in the block that may not be changed by the data to be written to the block may be identified and replicated and/or written to the second memory.

The block of the first memory may be erased (operation 550). For example, after data is read from a block of the first memory, the block may be erased.

Data in the second memory may be written to the first memory (operation 560). For example, data may be written to the erased block or another block of the first memory. The second memory may be at least as large as the block of the first memory, and thus the block may be written directly from the second memory and/or by sequentially transferring data from the second memory through a page buffer (e.g., page buffer 360 of memory 310, see FIG. 3) to a block in the first memory (e.g., block 330 in memory 310 of FIG. 3). Thus, log blocks may not be required to write data to a block or change data in a block. The second memory may be the same or approximately the same size as the first memory and thus data from the second memory may be written to all or at least a portion of the block. Data in the second memory may be written to a block in the sequence the data is stored on the second memory. Since a physical block may include portions of more than one logical block, data that changes a portion of a logical block may change only a portion of the physical block in which the portion of the logical block resides. Thus, data may have a similar arrangement on the second memory as it will when written to the first memory (e.g., thus logical block mapping may not need to be modified due to the writing of the received data).

Figure 6:
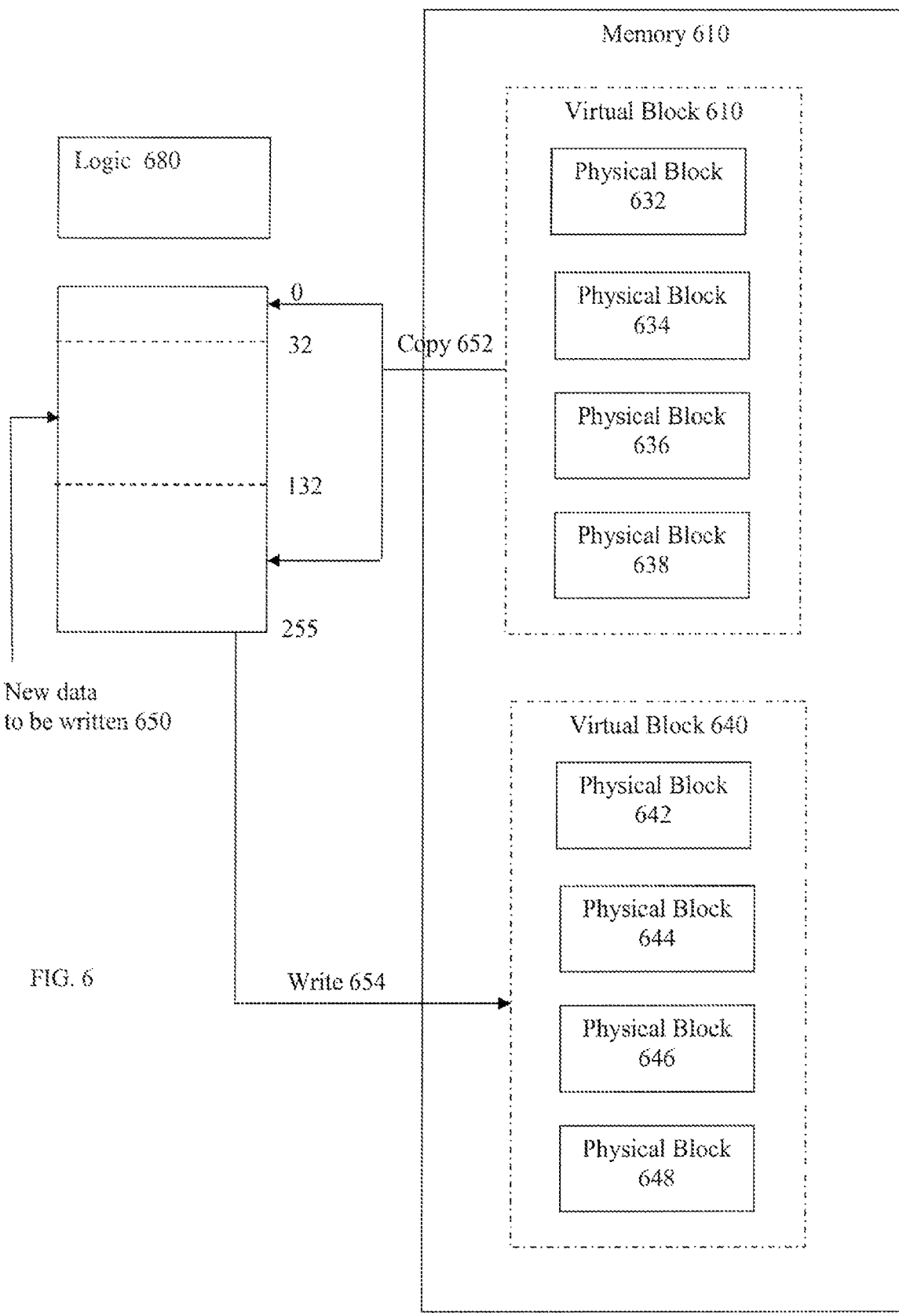
FIG. 6 illustrates a sequence of operations performed on a memory using a cache that is aligned with the blocks in the memory.

FIG. 6 illustrates a sequence of operations performed on a memory 610 using a cache 670 that is aligned with the blocks in the memory 610. In the illustrated example, data stored in the memory 610 is arranged in virtual blocks 630 and 640. Each virtual block 630 or 640 includes 256 pages of data distributed across four physical blocks 632, 634, 636, and 638 or 642, 644, 646, and 648 containing 64 pages each. In some implementations, however, the size of the virtual blocks may be larger or smaller than 256 pages and may be distributed across any number of physical blocks. In some implementations, a virtual block may be only a part of a physical block or multiple physical blocks.

A memory controller 620 associated with the memory 610 may receive a new data to be written 650 to the memory 610. In this example, the new data to be written 650 represents a modification (or replacement) of the data stored in the virtual block 630. Logic 680 within the memory controller 620 (or within a processor into which the memory controller 620 and/or cache 670 is incorporated) identifies the virtual block 630 that includes the data to be modified or replaced. In the illustrated example, pages 32-131 of the virtual block 630 are to be replaced with the new data to be written 650, while the remainder of the virtual block 630 remains unchanged. Accordingly, the logic 680 copies (operation 652) the unchanged pages (i.e., pages 0-31 and 132-255) from the virtual block 630 to the cache 678. In particular, the logic 680 copies the unchanged pages to corresponding locations within the cache 670 (i.e., cache locations that are aligned with pages 0-31 and 132-255 of a virtual block 630-640). In addition, the logic 680 stores the data to be written 650 to locations of the cache 670 that corresponds to the location within the virtual block 630 where the data to be modified or replaced is located. The data may be stored to the cache 670 in any sequence. For example, the logic 680 may copy pages 0-31, followed by storing the data to be written 650 to page 32-131 followed by copying unchanged pages 132-255. Alternatively, all of the copied pages may be stored to the cache 670 before storing the new data to be written 650, or vice versa. In general, however, regardless of when the data is actually moved to the cache 670, the sequence of data in the cache 670 is aligned with and corresponds to the sequence that the data will be stored to a virtual block 630 or 640.

Once the cache 670 is filled, the data in the cache 670 can be written to a virtual block 640 (operation 654) without a need to resequence the data. For example, the data in the cache may be written to four physical blocks 642, 644, 646, and 648 that make up the virtual block 640. Among other things, this technique avoids a need to write the new data to be written to a log block and to subsequently perform time-consuming merge operations (e.g., to copy the data for the overall virtual block from various different locations, such as portions of the original virtual block and the log block(s) where the new data is stored) to re-sequence the data and assemble the data in a single virtual block that is efficiently compacted across four physical blocks. In other words, the alignment of the cache 670 with a virtual block and the read operation necessary to copy existing data from the memory 610 to the cache 670 are more efficient (in terms of time, processing resources, and wear to the memory 610) than a merge operation.

In some implementations, it is possible to write the data assembled in the cache 670 to the original virtual block 630 (i.e., to the same physical blocks 632, 634, 636 and 638) rather than writing to a new virtual block 640 (as indicated at 654). In such a case, the original physical blocks 632, 634, 636 and 638 are erased after storing the necessary data to the cache 670 and before writing the data in the cache 670 back to the physical blocks 632, 634, 636 and 638 of the virtual block 630. In some cases, if only a portion of a virtual block 630 is being modified, it may not be necessary to copy all of the unchanged data to the cache 670. Instead, only the data from physical blocks that contain data to be modified or replaced need to be copied to the cache 670. For example, in the illustrated example, if physical block 638 contains pages 192-255, and those pages are not impacted by the new data to be written 650, it may be possible to store to the cache 670 only data for physical blocks 632, 634, and 636 that may be changed. This data can then be written to the physical blocks 632, 634, and 636 (to form virtual block 630 including physical block 638) or to physical blocks 642, 644, and 646 (to form a new virtual block composed of physical blocks 642, 644, 646, and 638).

In general, the described techniques may be implemented using known structures or components but using software or modified hardware that enables logic (e.g., logic 680) to be aware of the size of the virtual and/or physical blocks within a nonvolatile memory (e.g., NAND flash memory), to allocate an amount of RAM for use as a cache that corresponds to the size of the virtual and/or physical blocks, to arrange data within the cache in a sequence corresponding to the sequence of data in the block to be written, and/or to write data directly from the cache to the block without the need for resequencing, merging, etc. that can be necessary when, for example, the cache and/or the memory controller are not aware of the block size and/or use a cache that is smaller than (or not aligned with) the blocks of the nonvolatile memory.

In some implementations, a host may be a portable media device. A portable media device may be coupled to an external host such as a laptop. Data from the laptop, such as various media, may be transferred to the portable media device. Data may modify data on the first memory of the portable media device and/or may be new data. A portable media device may receive the data from the laptop. The received data may be stored on a memory of the portable media device. Blocks of data and/or data to be changed on the first memory by the received data may be identified (e.g., by a processor or a memory controller of the portable media device). The block may be erased after data is read from the block. Unchanged data in the block of data to be modified by the received data may be identified, read, and/or stored on the second memory. Data may be stored on the second memory in the sequence the data is to be written on the block of the first memory. Data from the second memory may be written to the erased block or a different block of the first memory.

In some implementations, a host may be a laptop. A user may enter data using a graphical interface and input devices such as a keyboard and a mouse. Data input by the user may be received by a processor of the laptop. The processor may identify block(s) of the memory to be changed by the data received. Data, if any, to be unchanged by the data received may be read to the cache of the laptop. The cache may be at least as large as a block of the memory of the laptop. The unchanged data and the data received may be stored in the cache in the sequence the data (e.g., unchanged data and/or data received) is to be written to a block of the first memory.

As described above, the second memory (e.g., cache) may be at least as large as a physical block, or the second memory may be as large as a virtual block. Because a virtual block may describe a portion of a memory block on which data can be stored, and a physical block size may include the portion of a physical block on which metadata is stored, the second memory may be at least as large as the virtual block. In some implementations, the second memory may be at least as large as a virtual block and either smaller or larger than a physical block. Furthermore, although blocks in the above systems and processes are described as having a block size, a first memory may include blocks of various sizes. A second memory may have a size at least as large as one or more of the blocks and/or at least as large as the largest block.

Although a user has been described as a human, a user may be a person, a group of people, a person or persons interacting with one or more computers, and/or a computer system, as appropriate.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the term "machine-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer (e.g., host or external host) having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to interact with a user as well. For example, feedback provided to the user by an output device may be any form of sensory feedback (e.g., visual feedback, auditory feedback, and/or tactile feedback) and/or input from the user may be received in any form, including acoustic, speech, or tactile input.

A number of implementations have been described. Nevertheless, it will be understood that various modifications may be made. A block may be erased after data is read or after data is stored in a cache of a host. As another example, a memory controller may determine a block size from metadata associated with a memory and an amount less than or equal to the block size may be stored in the second memory (e.g., cache) prior to writing the second memory to a block of the first memory. Among other modifications, the described operations may be performed in a different order than is described and some operations may be added or deleted. For example, a block may not be erased after data is read from a block. A block may be erased prior to writing data in the second memory to the block of the first memory. As another example, data received may be compared to data in a block to determine if at least a portion of data in the block should be changed by the data received. Accordingly, other implementations are within the scope of this application.

It is to be understood the implementations are not limited to particular systems or processes described. It is also to be understood that the terminology used herein is for the purpose of describing particular implementations only, and is not intended to be limiting. As used in this specification, the singular forms "a", "an" and "the" include plural referents unless the content clearly indicates otherwise. Thus, for example, reference to "a processor" includes a combination of two or more processors and reference to "a memory" includes mixtures of different types of memories.

What is claimed is:

1. A method for managing memory comprising:
storing data to be written to a first memory initially in a second memory, wherein the stored data is arranged in virtual blocks with each virtual block having a size and an order substantially equal to a size and an order for subsequent storage in a corresponding physical block in the first memory, wherein the second memory is coupled to the first memory and a memory controller, and wherein the first memory includes nonvolatile memory; and
writing each virtual block from the second memory to the corresponding physical block of the first memory.

2. The method of claim 1 wherein the first memory comprises electrically erasable memory.

3. The method of claim 1 wherein each corresponding physical block of the first memory is configured such that cells of the block are not individually erasable.

4. The method of claim 1 further comprising receiving the data to be stored in the first memory.

5. The method of claim 4 wherein at least one corresponding physical block of the first memory comprises data, and further comprising writing at least a portion of the data in the at least one corresponding physical block of the first memory to the virtual block in the second memory.

6. The method of claim 5 wherein the portion of data written to the second memory comprises data to be unchanged by the received data.

7. The method of claim 6 further comprising writing the data received and the portion of the data to be written to the first memory from the second memory such that the data received and the portion of the data are written to the second memory in the sequence that the first set of data and at least the portion of the second set of data will be stored on the first memory.

8. The method of claim 1 further comprising erasing the block of the first memory.

9. A system comprising:
a first memory comprising one or more blocks, wherein a block includes one or more cells, and wherein cells are not individually erasable, and wherein the first memory comprises nonvolatile memory;
a second memory coupled to the first memory, wherein the second memory is at least as large as one of the blocks of the first memory; and
a memory controller coupled to the first memory and the second memory, and wherein the memory controller is operable to store data to be written to the first memory initially in the second memory arranged in virtual blocks with each virtual block having a size and an order substantially equal to a size and an order for subsequent storage in a corresponding physical block in the first memory and write each initial block in the second memory to the corresponding block in the first memory.

10. The system of claim 9 wherein the memory controller is operable to receive data to be written to the first memory.

11. The system of claim 10 wherein the memory controller is operable to identify data on the first memory to be changed by the data received.

12. The system of claim 9 wherein the first memory is a NAND flash memory.

13. The system of claim 9 wherein the second memory is a cache.

14. A system comprising:
a first means for storing data comprising one or more blocks, wherein a block includes one or more cells, and wherein cells are not individually erasable;
a second means for storing data, wherein the second means for storing data is at least as large as the first means for storing data; and
a means for controlling the first means for storing data and second means for storing data, wherein the means for controlling data is operable to store data to be written to the first means for storing data initially in the second means for storing data arranged in initial blocks with each initial block having a size and an order substantially equal to a size and an order for subsequent storage in a corresponding block in the first means for storing data and write each initial block in the second means for storing data to the corresponding block in the first means for storing data.

15. The system of claim 14 further comprising a means for identifying data in the first memory to be changed by data to be written to the first memory.

* * * * *